(12) United States Patent
Curatola

(10) Patent No.: US 8,227,841 B2
(45) Date of Patent: Jul. 24, 2012

(54) SELF-ALIGNED IMPACT-IONIZATION FIELD EFFECT TRANSISTOR

(75) Inventor: Gilberto Curatola, Korbek-lo (BE)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 304 days.

(21) Appl. No.: 12/431,670

(22) Filed: Apr. 28, 2009

(65) Prior Publication Data

US 2009/0289298 A1 Nov. 26, 2009

(30) Foreign Application Priority Data

Apr. 28, 2008 (EP) .................................. 08103748

(51) Int. Cl.
*H01L 29/76* (2006.01)
(52) U.S. Cl. ......... 257/288; 257/900; 438/298; 438/301
(58) Field of Classification Search ........... 257/E27.099, 257/E29.13, 288, 900, 341, 350, 401, E29.179, 257/901; 438/292, 293, 294, 295, 296, 297, 438/298, 299, 300, 301, 302, 303, 304, 305, 438/306, 307, 308
See application file for complete search history.

(56) References Cited

U.S. PATENT DOCUMENTS

| | | | | |
|---|---|---|---|---|
| 7,361,563 B2 * | 4/2008 | Shin et al. | ..................... | 438/300 |
| 2006/0113612 A1 * | 6/2006 | Gopalakrishnan et al. | ... | 257/392 |
| 2006/0125041 A1 * | 6/2006 | Yang et al. | ..................... | 257/476 |
| 2006/0202254 A1 * | 9/2006 | Lai et al. | ........................ | 257/315 |
| 2007/0114580 A1 * | 5/2007 | Kodama | ......................... | 257/288 |
| 2009/0170268 A1 * | 7/2009 | Teo et al. | ....................... | 438/285 |
| 2010/0044760 A1 | 2/2010 | Curatola et al. | | |

OTHER PUBLICATIONS

Final Office Action mailed Dec. 22, 2011, U.S. Appl. No. 12/514,940, 19 pages, United States Patent and Trademark Office, Alexandria, Virginia.

* cited by examiner

*Primary Examiner* — Ha Tran T Nguyen
*Assistant Examiner* — Thanh Y Tran
(74) *Attorney, Agent, or Firm* — Haynes and Boone, LLP

(57) ABSTRACT

An impact ionization MOSFET is formed with the offset from the gate to one of the source/drain regions disposed vertically within the device structure rather than horizontally. The semiconductor device comprises a first source/drain region having a first doping level; a second source/drain region having a second doping level and of opposite dopant type to the first source/drain region, the first and second source/drain regions being laterally separated by a silicon-germanium intermediate region having a doping level less than either of the first and second doping levels; a gate electrode electrically insulated from, and disposed over, the intermediate region, the first and second source/drain regions being laterally aligned with the gate electrode; where the entire portion of the first source/drain region that forms a boundary with the intermediate region is separated vertically from the top of the intermediate region.

21 Claims, 18 Drawing Sheets

SELF-ALIGNED IMPACT-IONIZATION FIELD EFFECT TRANSISTOR

CROSS REFERENCE

This application claims priority to European patent application number 08103748.3, filed Apr. 28, 2008, the disclosure of which is incorporated herein by reference.

BACKGROUND

The present invention relates to the fabrication of field effect transistor devices in which an insulated gate electrode is used to control an electric field in a semiconductor intermediate region between two more highly doped source/drain regions.

A significant problem faced recently in the semiconductor industry is the control of short channel effects in nanoscale transistor devices. As a consequence of the reduced control exerted by gate electrodes over carriers in an inversion channel beneath the gate electrode, there may be a significant degradation of sub-threshold slope in the high longitudinal field resulting from the drain to source voltage VDS, and a consequent increase in off-state current. High off-state current is undesirable since it reduces the ability to control the transistor using the gate electrode and increases total static power consumption.

In a conventional bulk MOSFET device, the off-state current is represented by a thermal diffusion current over a potential barrier and, therefore, the Fermi-Dirac distribution of carriers in any case limits the minimum sub-threshold slope to the well-known value of 60 mV/decade. This ultimately provides a limitation on switching speed of the transistor even if short channel effects are perfectly controlled.

Therefore, there has been considerable interest in alternative devices based on different transport mechanisms where the intrinsic 60 mV/decade limit can be overcome. These alternative devices include tunnel devices and impact ionization devices which have a high degree of compatibility with conventional CMOS fabrication processes.

SUMMARY

It is one object of the present disclosure to provide an improved process for fabricating impact-ionization MOSFET devices. It is another object to provide an alternative structure for an impact-ionization MOSFET device (hereinafter "IIMOS device").

According to one of the broader forms of an embodiment of the present invention which provides a semiconductor device comprising:

a first source/drain region having a first doping level;

a second source/drain region having a second doping level and of opposite dopant type to the first source/drain region;

the first and second source/drain regions being laterally separated by a silicon-germanium intermediate region having a doping level less than either of the first and second doping levels;

a gate electrode electrically insulated from, and disposed over, the intermediate region, the first and second source/drain regions being laterally aligned with the gate electrode;

the entire portion of the first source/drain region that forms a boundary with the intermediate region being separated vertically from the top of the intermediate region.

According to another one of the broader forms of an embodiment of the present invention which provides a method for fabricating a semiconductor device on a substrate comprising the steps of:

forming a first source/drain region having a first doping level;

forming a second source/drain region having a second doping level and of opposite dopant type to the first source/drain region, the first and second source/drain regions being laterally separated by a silicon-germanium intermediate region having a doping level less than either of the first and second doping levels, wherein the entire portion of the first source/drain region that forms a boundary with the intermediate region is separated vertically from the top of the intermediate region; and forming a gate electrode electrically insulated from, and disposed over, the intermediate region, the first and second source/drain regions being laterally aligned with the gate electrode.

BRIEF DESCRIPTION OF THE DRAWINGS

Embodiments of the present invention will now be described by way of example and with reference to the accompanying drawings in which.

DETAILED DESCRIPTION

Figure 1:
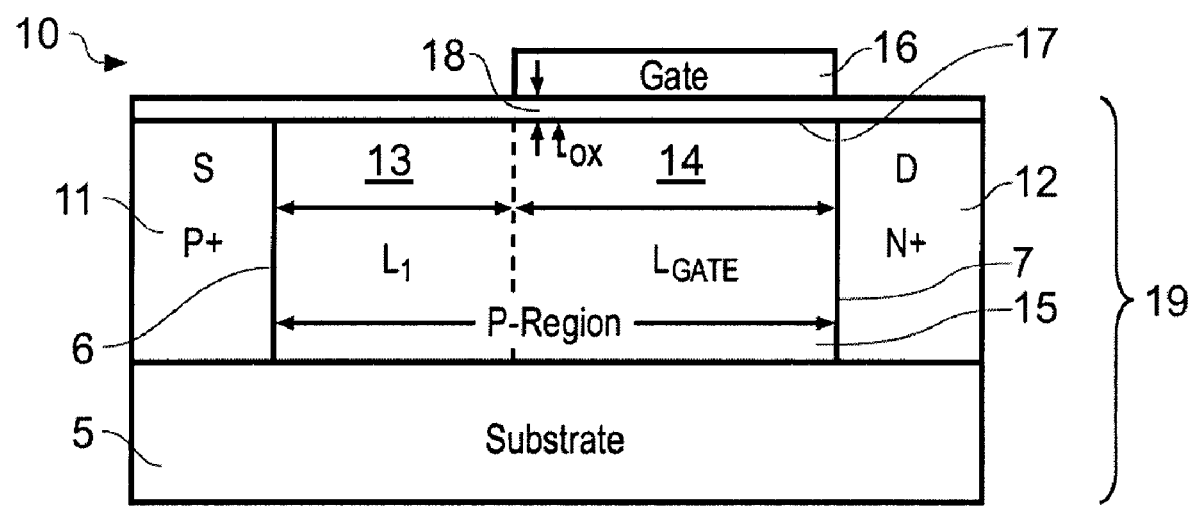
FIG. 1 shows a schematic cross-sectional view of a conventional IIMOS device.

FIG. 1 illustrates a conventional IIMOS device 10. A highly doped p+ source region 11 and a highly doped n+ drain region 12 are laterally separated by an intermediate region 15 which comprises a lightly doped p− region. A gate electrode 16 is formed over a first part 14 of the intermediate region 15 which part is hereinafter referred to as the 'gate region' 14. The gate electrode 16 is adjacent to the drain region 12, and is separated from the surface 17 of the intermediate region 15 by a thin gate dielectric 18. The gate electrode 16 does not extend laterally as far as the p+ source region 11, leaving a second part 13 of the intermediate region 15 which is not covered by the gate electrode 16, hereinafter referred to as the 'extension region' 13. The source and drain regions 11, 12 and intermediate region 15 are conventionally formed in a semiconductor layer 19 on top of a suitable substrate 5.

The gate electrode 16, when electrically biased, is configured to enable the accumulation of carriers (e.g. electrons)

under the gate electrode 16 to form an accumulation surface channel. The intermediate region 15 (and particularly the 'extension region' 13) acts as an acceleration path for the carriers in the channel sufficient to generate impact ionization events. The height of the acceleration barrier is controlled by the voltage applied to the gate electrode 16. When the gate voltage is low and insufficient to invert the gate region 14, the maximum energy that the carriers can reach is not sufficient to generate ionization events. When the gate voltage is high and sufficient to form an inversion layer beneath the gate, there is an increased field strength laterally across the intermediate region enabling avalanche multiplication of the carriers and an abrupt increase in the transistor on-current. With such a structure, a sub-threshold slope of 5 mV/decade has been observed.

There are a number of disadvantages with this device structure, however. It is preferable that a field effect transistor is 'self-aligned' in the sense that the material of the gate electrode 16 itself is used to define the critical positions of the source/drain regions. In conventional MOSFET devices, this is achieved by using the gate 16 material as a mask against the doping of the source/drain regions, the edges of which (e.g. junction 7 in FIG. 1) must be immediately adjacent to the gate electrode. An ion implant of the p+ and n+ doping materials (e.g. boron and arsenic) can be masked by the gate 16 thereby ensuring that the dopant is correctly laterally aligned in the semiconductor layer 19.

In the device of FIG. 1, this can be achieved with the n+ implant for the drain region 12, which must be aligned with the edge of the gate electrode 16. However, it can readily be seen that this is not possible for the p+ implant for the source region 11, because the source region 11 is intentionally laterally offset from the left hand edge of the gate electrode 16. Therefore, positioning of the p+ implant relative to the gate electrode typically has to be controlled photolithographically during masking. The lateral offset, indicated by distance $L_1$ is a critical dimension of the device 10 and reliance on photolithographic alignment control is undesirable.

Another disadvantage is that the additional dimension of the extension region 13 increases the area of the device on the silicon substrate which is counterproductive to efforts to shrink dimensions of the device. A further disadvantage is that, owing to the large energy gap of silicon, a high voltage is required to generate impact ionization events.

Figure 2:
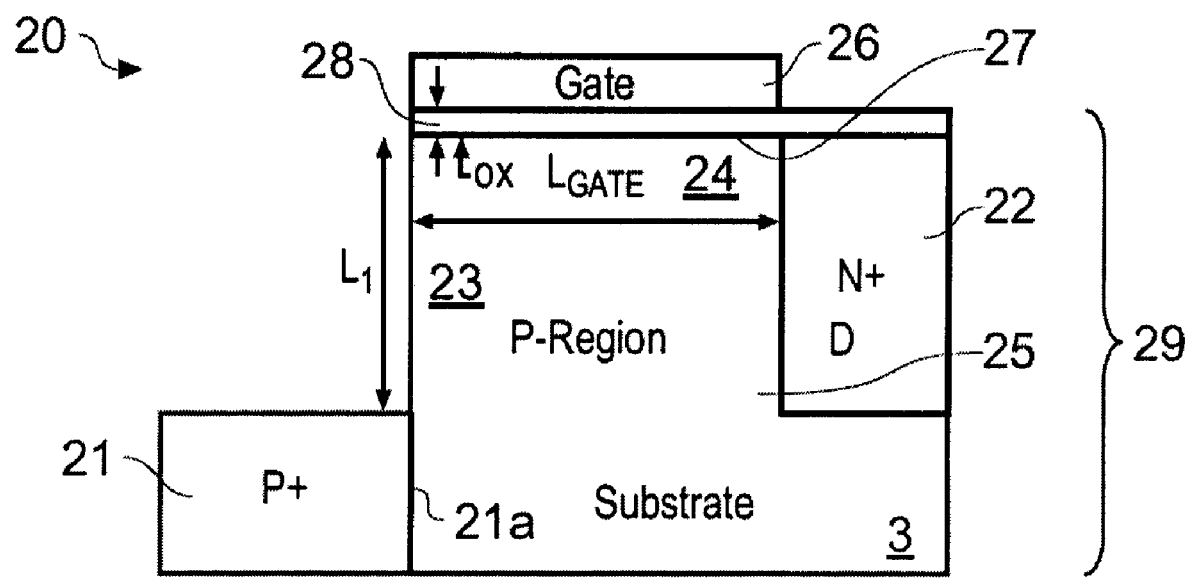
FIG. 2 shows a schematic cross-sectional view of a self-aligned IIMOS device.

Referring also to FIG. 2, in the present invention the 'extension region' that provides the offset between the gate electrode and the source or drain region is not provided as a lateral offset $L_1$ as in FIG. 1, but as a vertical offset $L_1$ as shown in FIG. 2.

Thus, in more detail, the exemplary IIMOS device 20 of FIG. 2 comprises a drain region 22 and an intermediate region 25 formed in a semiconductor layer 29. In similar manner to FIG. 1, a gate electrode 26 is formed over the intermediate region 25, adjacent to the drain region 22, and is separated from the surface 27 of the intermediate region 25 by a gate dielectric 28. A source region 21 is provided vertically offset from the gate 26 and from the top surface 27 of the intermediate region 25 by a distance $L_1$. The gate region 24 (i.e. that portion of the intermediate region 25 where the field effects of the gate electrode dominate) is separated from the interface or boundary 21a of the source region 21 with the intermediate region 25 by an extension region 23 which extends vertically. The source and drain regions 21, 22 and intermediate region 25 are conventionally formed in a semiconductor layer 29 on top of or, in this example, forming part of a suitable substrate 3.

As will become clear later in discussion of suitable fabrication processes, the source region 21 can now be self-aligned with the gate electrode 26 while still preserving an offset $L_1$ between the gate region 24 and the source region 21. In this arrangement, the offset is, of course, vertical. The expressions 'horizontal' and 'vertical' as used herein are not intended to limit the disposition of a device 20 but to distinguish between the plane of the gate electrode ('horizontal') and a direction orthogonal thereto ('vertical').

It will also be clear that the offset $L_1$ between gate region 24 and the source region 21 can now be achieved without significant utilisation of additional device area on the substrate, or with at least substantially reduced area compared with the device of FIG. 1.

It will be understood that, depending on the device configuration required, the polarity of the source and drain regions 21, 22 can be reversed and the intermediate region may be provided as an intrinsic undoped region or a lightly doped region of either polarity n– or p–. In either case, the intermediate region has a doping level less than that of the source and drain regions. The designations of source and drain may be reversed. Thus, elsewhere in the specification, the relevant regions 21, 22 may be referred to as 'source/drain' regions to maintain generality. The source and drain regions may be of opposite dopant type or the same. The source and drain regions may have the same doping levels or may be different.

Suitable processes for fabricating devices exemplified schematically by FIG. 2 and variations thereof will now be discussed. Throughout the present specification, unless required otherwise by the context, the expression 'substrate' is used to refer not only to the original (e.g. silicon wafer) substrate, but also to include any subsequently deposited and/or defined layers up to the relevant point in the process being described.

Figure 3A:
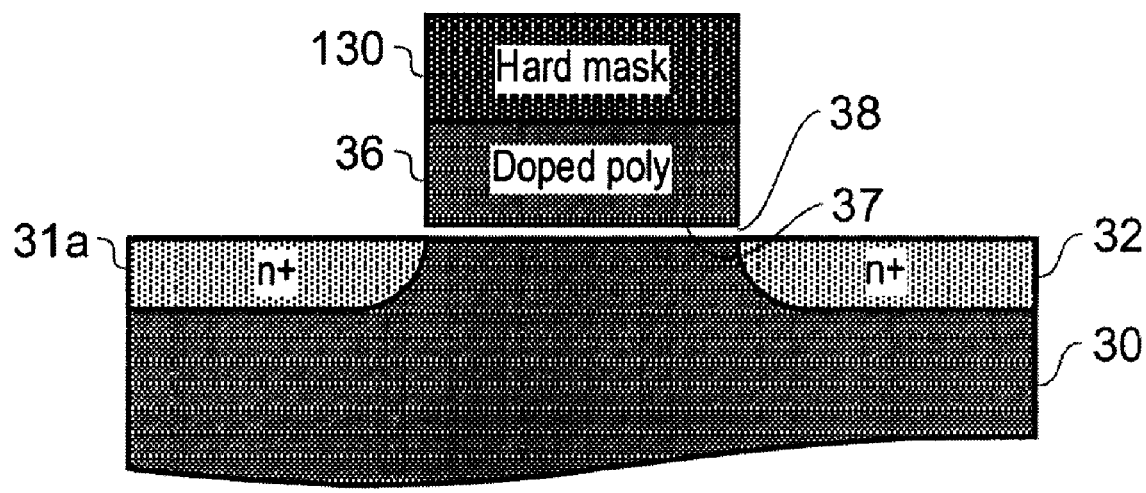
FIGS. 3a to 3f show a series of schematic cross-sectional views depicting a process sequence for fabrication of a device according to FIG. 2.

FIG. 3a shows a partially completed device fabricated on a substrate according to well known FET fabrication techniques. A gate dielectric 38 has been deposited or grown on the surface 37 of the substrate 30. For example, this dielectric could be formed by oxidation of the surface of the substrate 30. Then, a layer of polysilicon has been deposited and doped to be suitably electrically conductive for use as a gate electrode, covered with a hard mask material 130 such as SiN, SiON, SiO2 or advanced patterning films and subsequently photolithographically defined. The source/drain regions 31a, 32 are then ion implanted with suitable n-type dopant, such as phosphorus or arsenic. The lateral extent of the source/drain regions 31, 32 is defined in part by the presence of the polysilicon gate electrode 36 and hard mask 130 and elsewhere by a suitable photoresist mask (not shown).

Figure 3B:
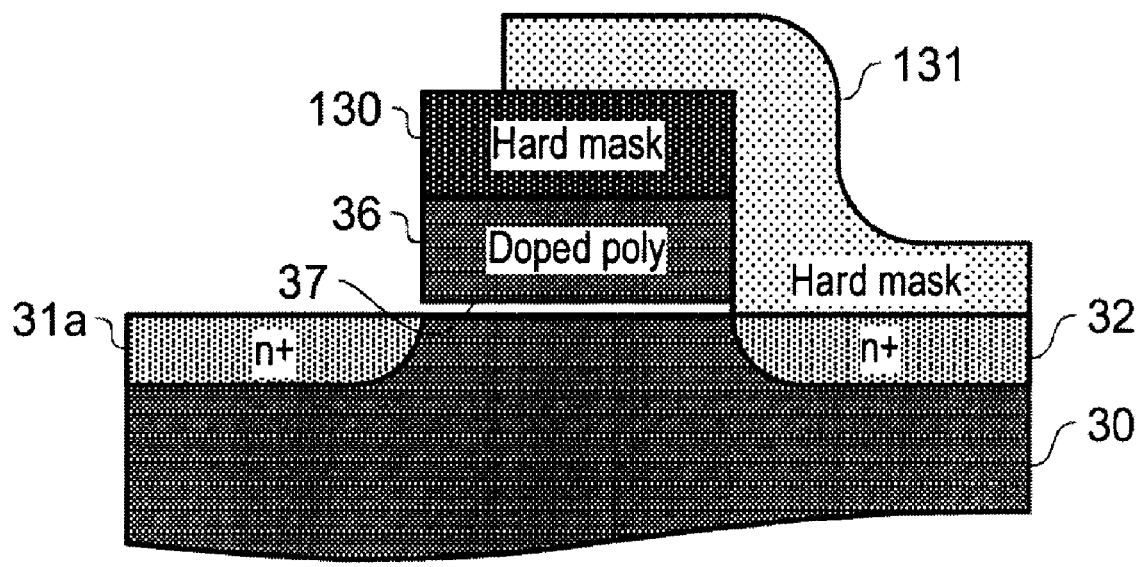

As shown in FIG. 3b, a second hard mask 131 is deposited onto the substrate and photolithographically defined to cover the source/drain region 32 but not to cover the source/drain region 31a. The second hard mask may be formed using the same or similar materials as for the first hard mask 130.

Figure 3C:
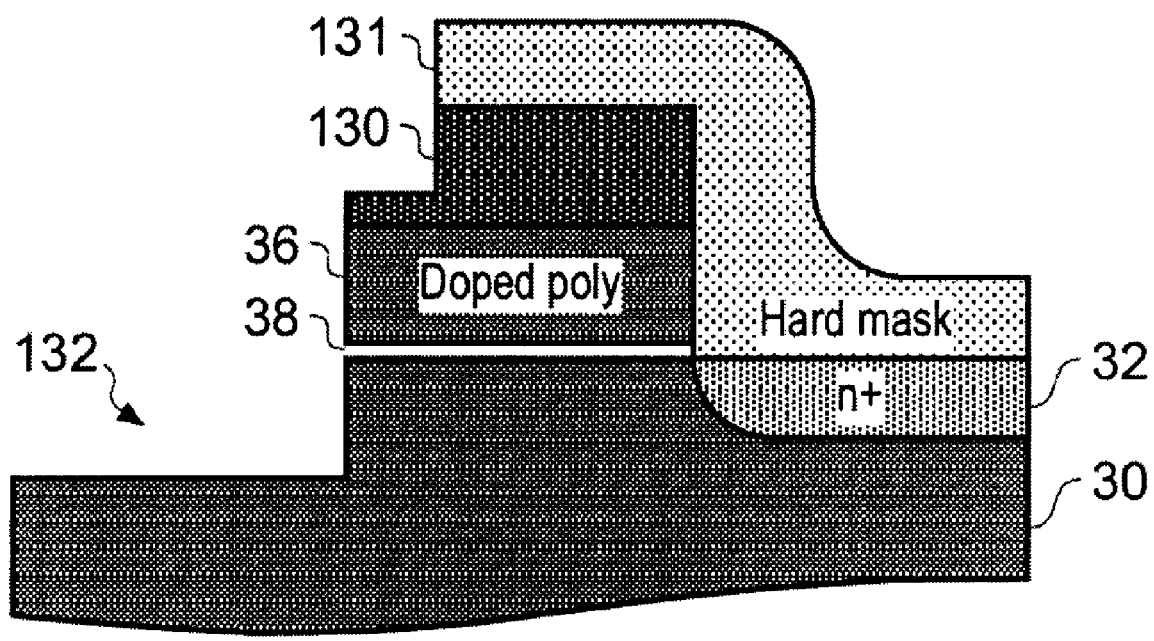

As shown in FIG. 3c, a recess 132 is etched into the substrate in the source/drain region 31a. The etch depth is preferably approximately equal to the intended length of the extension region 23, i.e. $L_1$, and more generally may be of similar magnitude to the gate length $L_{GATE}$. The etch process is effectively self-aligned relative to an edge of the gate electrode 36 by virtue of the first hard mask 130. In this process, it will be noted that the n-type doping introduced to n+ region 31a is effectively removed. In practice, if convenient, the mask for the original n+ implant (FIG. 3a) could have covered this region preventing doping of the source/drain region 31a. During the recess etch, the rest of the substrate is protected by the second hard mask 131 and by small areas of the first hard mask 130 that remain exposed.

Figure 3D:
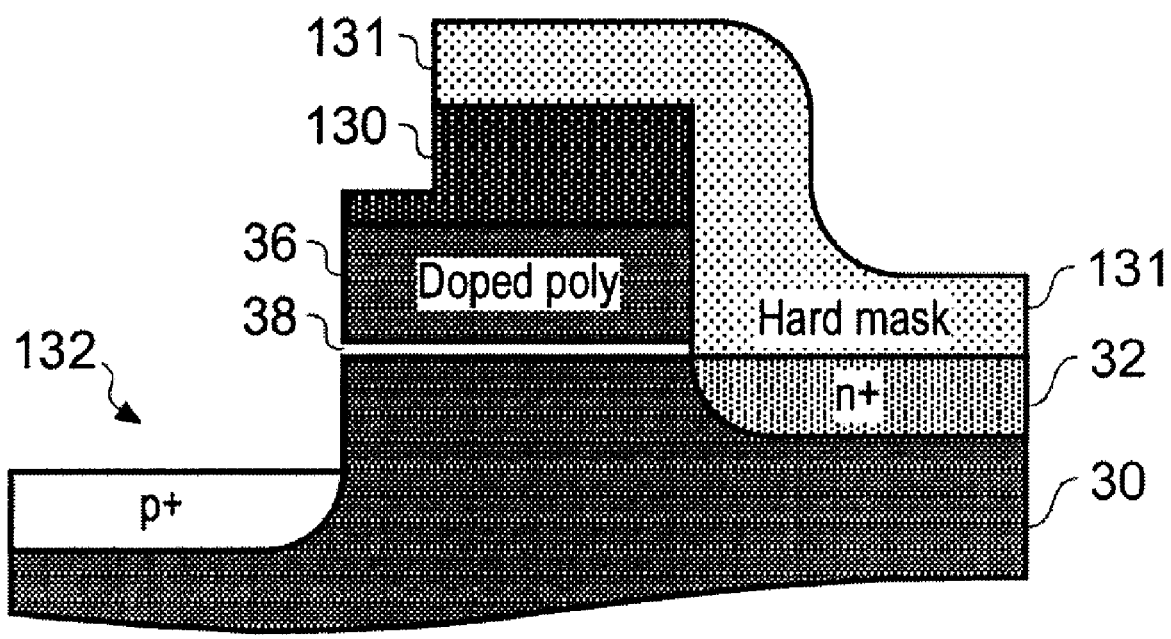

As shown in FIG. 3d, p-type dopant is implanted into the bottom of the recess 132, e.g. by ion implantation, to form a p+ source/drain region 31. The implant is masked elsewhere at least by the first and second hard masks 130, 131. It will be noted that the p+ implant is effectively self-aligned relative to an edge of the gate electrode 36 by virtue of the first hard mask 130 and the gate electrode 36 itself.

Figure 3E:
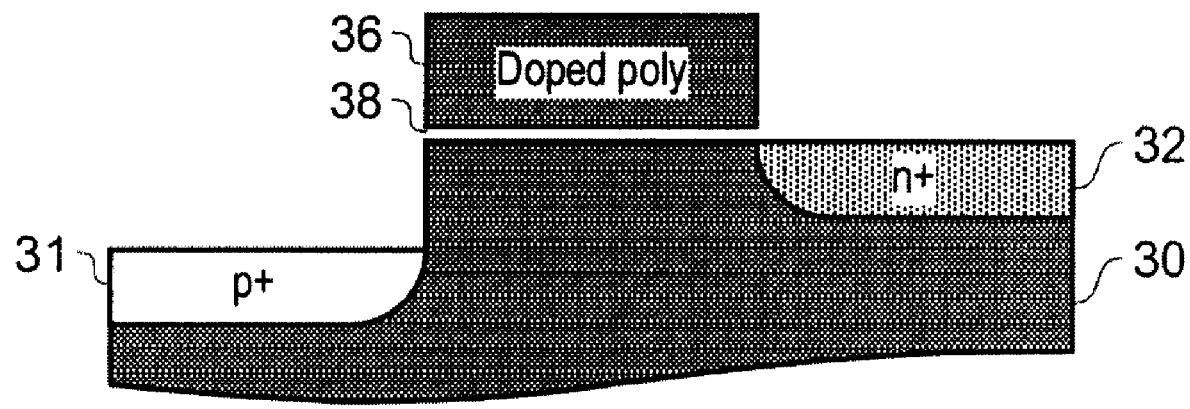

Then, as shown in FIG. 3e, the first and second hard masks 130, 131 are stripped. There may also be a thermal activation process to activate the n- and ptype dopants of the source/drain regions 31, 32.

Figure 3F:
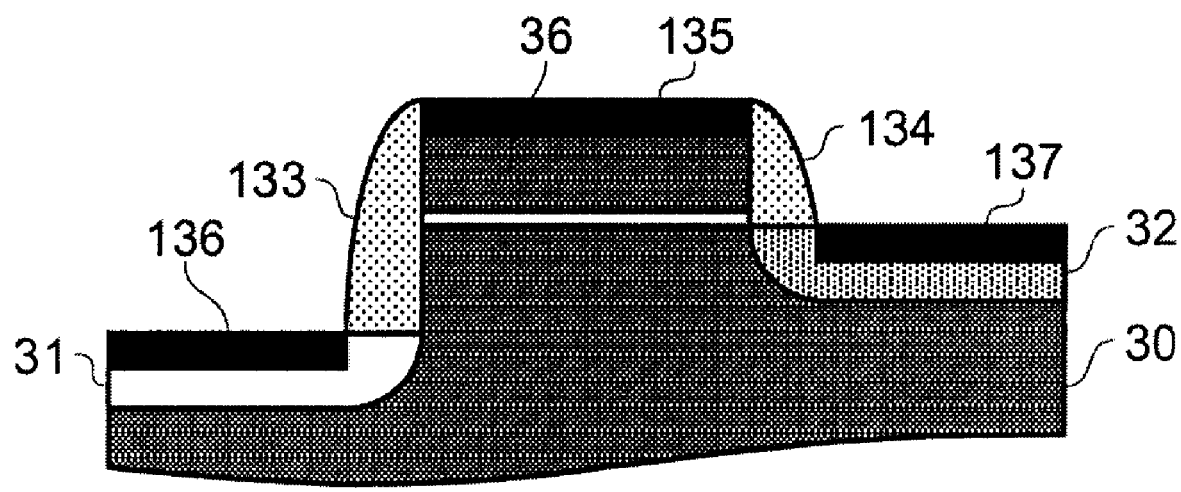

As shown in FIG. 3f, sidewall spacers 133, 134 of suitable dielectric material are deposited using known techniques. Then, silicide caps 135, 136, 137 are formed respectively on the gate electrode 36, the source/drain region 31 and the source/drain region 32. These may be formed using any suitable known process such as deposition of titanium or other metal and thermal processing to react with the underlying silicon, followed by removal of unreacted metal in areas where the substrate was otherwise protected by dielectric spacers 133, 134 or other field oxide layers (not shown).

It will be noted from FIG. 3f that the source/drain region 31 and its contact silicide layer 136 may be substantially below the level of the corresponding contact silicide layer 137 of source/drain region 32. If this proves inconvenient for subsequent processing of interconnect materials to the source/drain regions, such as metal layers, then the source/drain region 31 may be planarized up to the level of the source/drain region 32 using options such as those discussed later.

It will also be noted that other variations in the above process may be made. For example, it may be adapted to use a metal gate electrode material rather than a polysilicon gate. If suitable selectivity of etches against the gate electrode material itself can be achieved, then the first hard mask 130 might be dispensed with. Similarly, the second hard mask 131 might alternatively be replaced with a suitable photoresist mask.

FIGS. 4a to 4e depict a process in which adjacent devices on the substrate are separated by a trench isolation structure and in which the source/drain regions are formed using two stage processes.

Figure 4A:
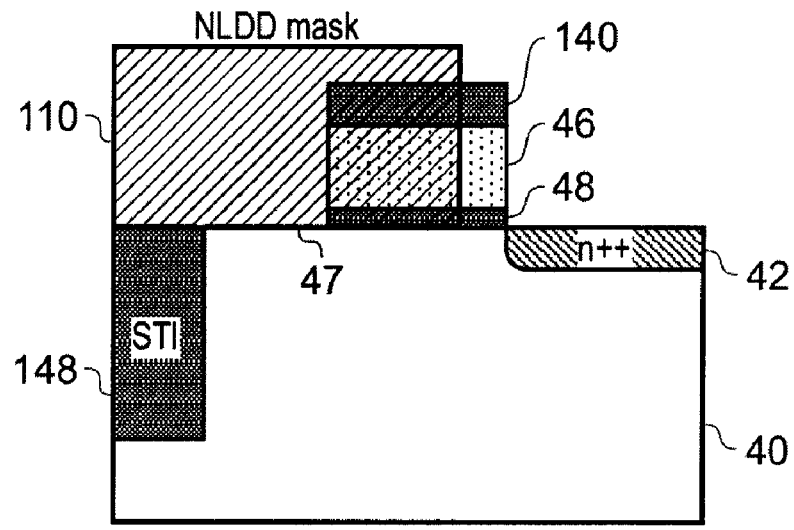
FIGS. 4a to 4e show a series of schematic cross-sectional views depicting an alternative process sequence for fabrication of a device according to FIG. 2.

FIG. 4a shows a partially completed device fabricated on a substrate 40 according to well known FET fabrication techniques. A gate dielectric 48 has been deposited or grown on the surface 47 of the substrate 40. A gate electrode material and hard mask material have been deposited and subsequently photolithographically defined to form gate 46 and hard mask 140. A trench isolation structure 148 has been formed in the substrate to isolate the device from adjacent devices. The source/drain region 42 has been given a first ion implantation with suitable n-type dopant using a suitable mask 110. The lateral extent of the source/drain region 42 is defined by the presence of the gate electrode 46 and hard mask 140 and elsewhere by the photoresist mask 110.

Figure 4B:
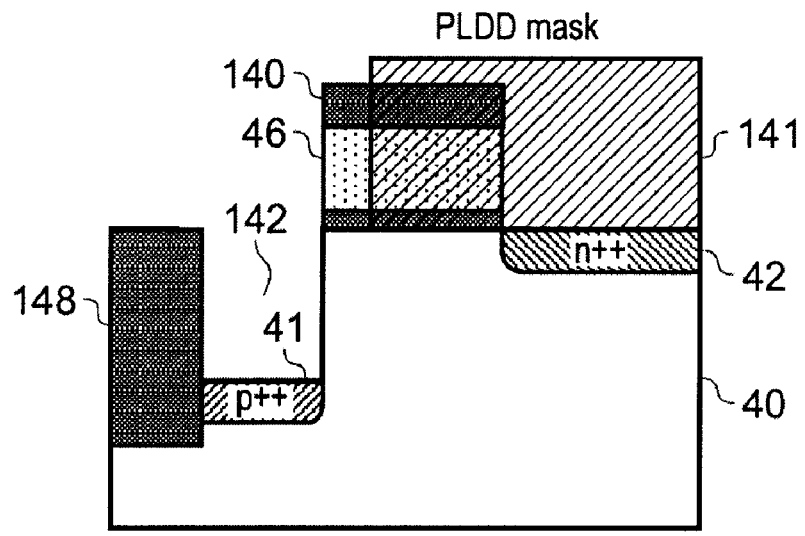

As shown in FIG. 4b, a second mask 141 is photolithographically defined on the substrate to cover the source/drain region 42 and a recess or trench 142 is etched into the substrate 40 in the source/drain region 41. The etch depth is preferably approximately equal to the intended length of the extension region 23, i.e. $L_1$. The etch process is effectively self-aligned relative to an edge of the gate electrode 46 and hard mask 140, and self-aligned to the trench isolation structure 148. A p+ source/drain implant is then used to implant p-type dopant into the substrate at the base of the recess 142, thereby forming the source/drain region 41. The p+ implant process is effectively self-aligned relative to an edge of the gate electrode 46 and hard mask 140, and self-aligned to the trench isolation structure 148, and the implant is masked elsewhere at least by the hard masks 140 and the mask 141.

Figure 4C:
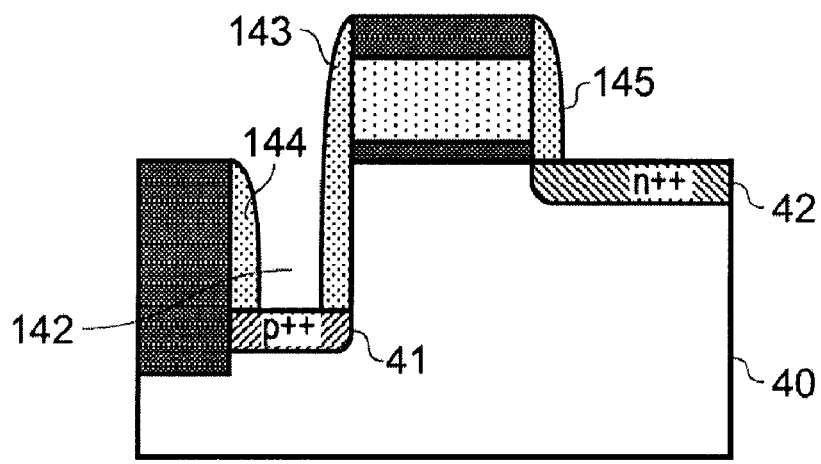

As shown in FIG. 4c, the mask 141 is stripped and sidewall spacers 143, 144 and 145 of suitable dielectric material are deposited using known techniques.

Figure 4D:
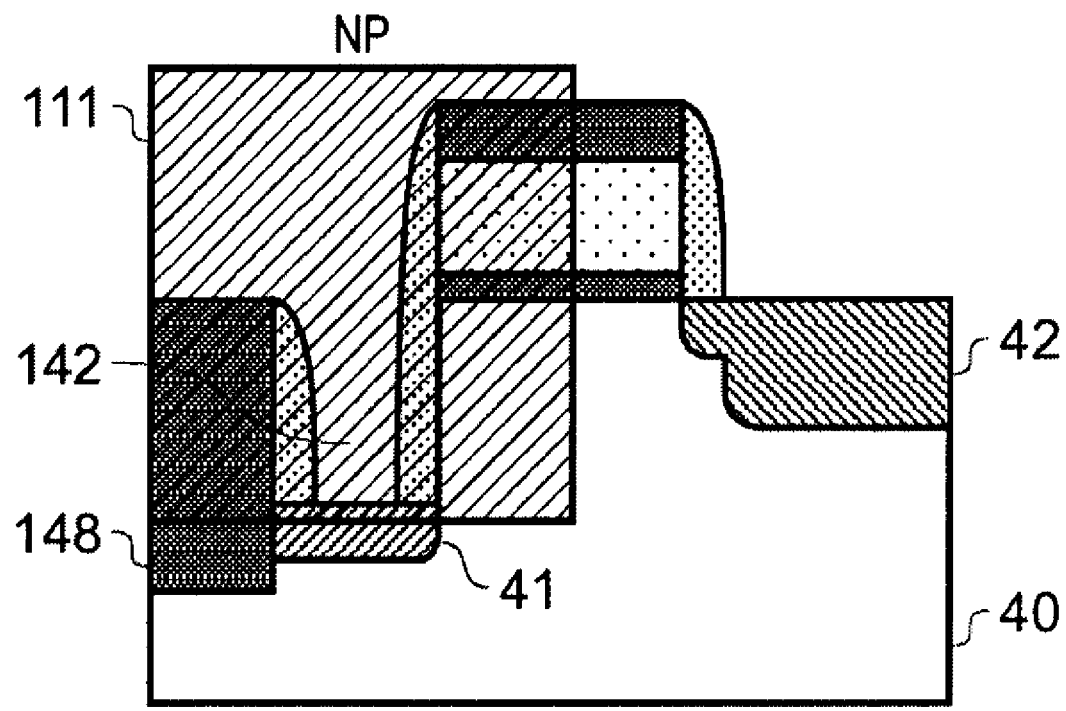

As shown in FIG. 4d, the trench 142 and source/drain region 41 are covered by a photoresist mask 111 leaving the source/drain region 42 exposed. A further implant process is used at higher energy to implant further n-type dopant into the source/drain region 42.

Figure 4E:
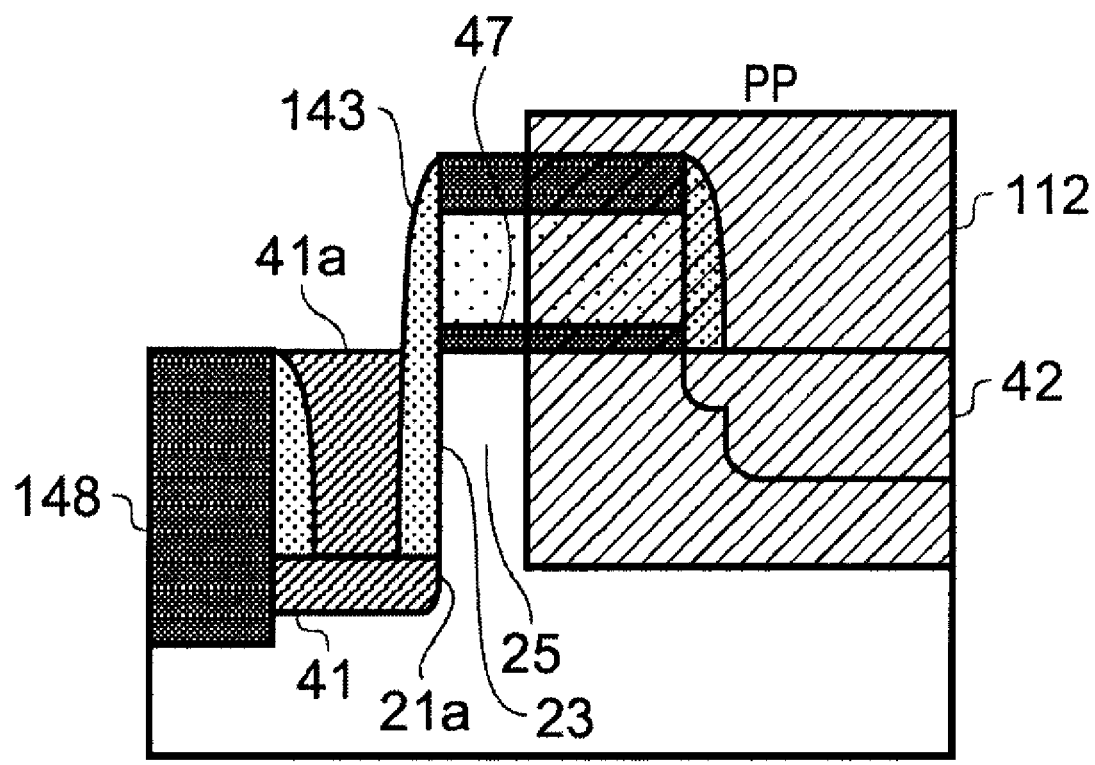

As shown in FIG. 4e, the source/drain region 42 is covered by a photoresist mask 112 leaving the trench 142 and source/drain region 41 exposed. An epitaxial deposition process is then used to deposit a further part 41a of the source/drain region by selective deposition on the exposed silicon of the source/drain region 41. It will be seen, therefore, that the p+ source/drain region in the trench now comprises two portions: a first portion 41 disposed at the bottom 35 of the trench (in this case implanted into the substrate at the bottom of the trench) and a second portion 41a within the trench that is separated physically and electrically from the sidewall of the trench and thus separated from the extension region 23 of length $L_1$ by way of the insulating spacer structure 143.

It can be seen that the portion 41 of the source/drain region that defines the boundary 21a with the intermediate region 25 is separated vertically from the top 47 of the intermediate region, while the rest of the source/drain region 41a is separated laterally by an insulating spacer structure 143. It can also be seen that in this particular instance the portion 41 of the source/drain region that defines the boundary 21a with the intermediate region 25 is separated vertically from the entirety of the source/drain region 42.

In this process, the masks 110, 111, 112 are critically aligned to the gate 46 and therefore can work with gate lengths down to at least 30 nm.

FIGS. 5a to 5d depict a process in which the n+ implant of the source/drain region 52 is not photolithographically masked, relying on the fact that the resulting implant into the substrate at the other side of the gate (shown as region 51b) will be removed during recess etch.

Figure 5A:
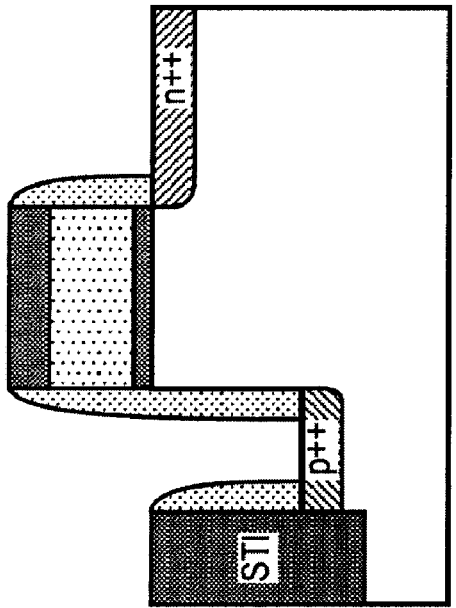
FIGS. 5a to 5d show a series of schematic cross-sectional views depicting an alternative process sequence for fabrication of a device according to FIG. 2.

FIG. 5a shows a trench isolation structure 158, source/drain region 52, gate dielectric 58, gate electrode 56 and hard mask 150 similar to that already explained. The implanted region 51b will be sacrificed as shown in FIG. 5b.

Figure 5B:
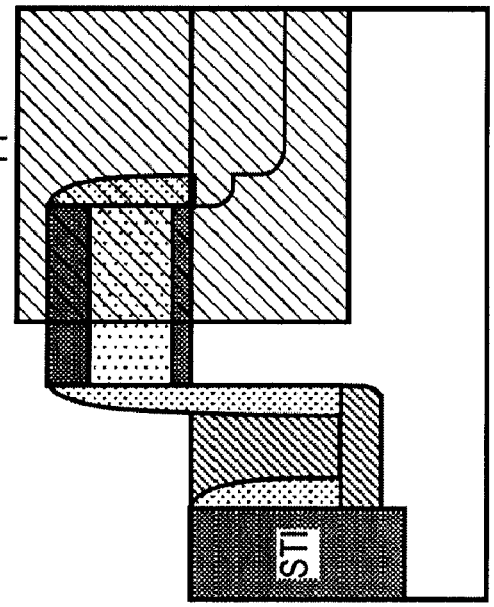
Figure 5C:
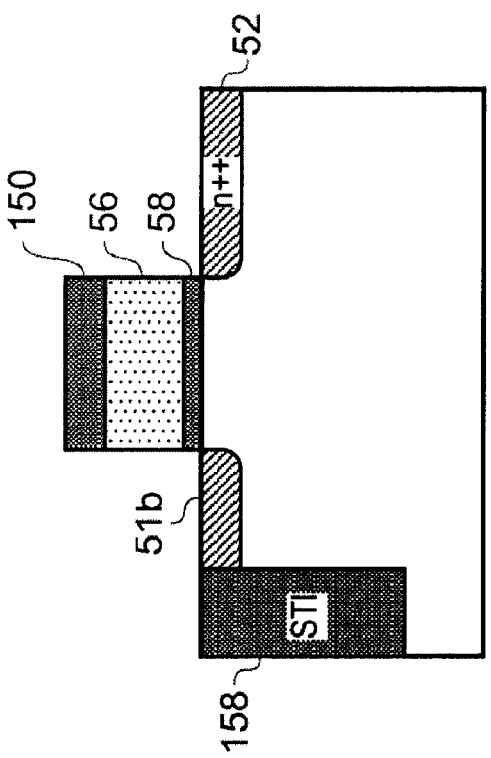
Figure 5D:
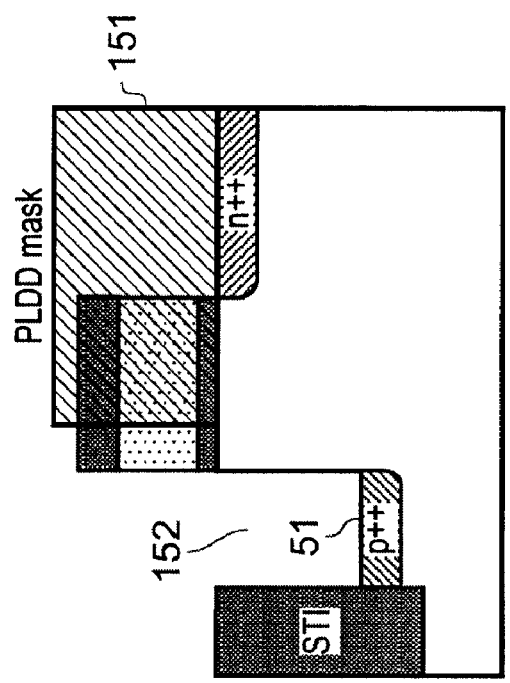

FIG. 5b shows the structure after the recess has been etched and the p+ source/drain region 51 implanted using mask 151. The remaining process steps are similar to those described in connection with FIGS. 4c and 4e (the additional source/drain implant step of FIG. 4d being omitted for convenience).

FIGS. 6a to 6h depict a process in which adjacent devices are formed with a common source/drain region, as commonly required. This shows how the source/drain region 21 adjacent the extension region 23 for two adjacent devices can share the same trench or recess. This process also reduces the number of photolithography masks that need to be aligned to the gate structures.

Figure 6A:
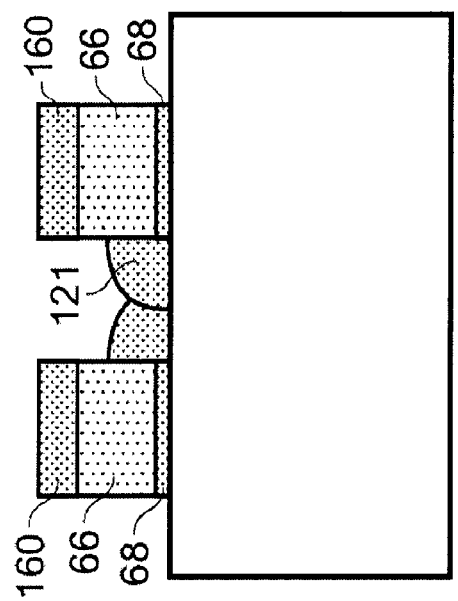
FIGS. 6a to 6h show a series of schematic cross-sectional views depicting an alternative process sequence for fabrication of a pair of devices each according to FIG. 2.
Figure 6C:
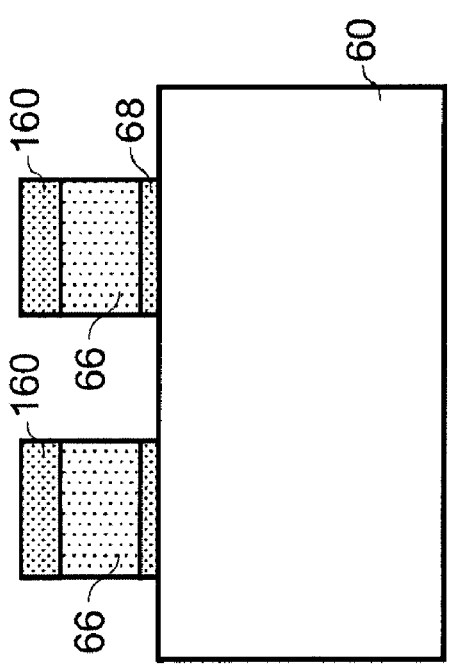
Figure 6B:
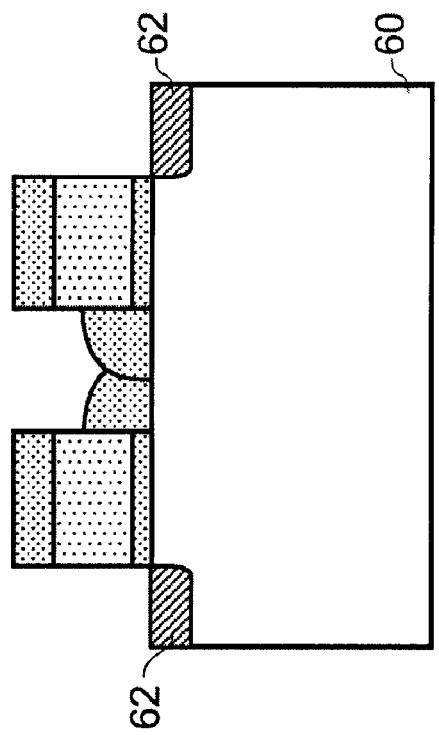
Figure 6D:
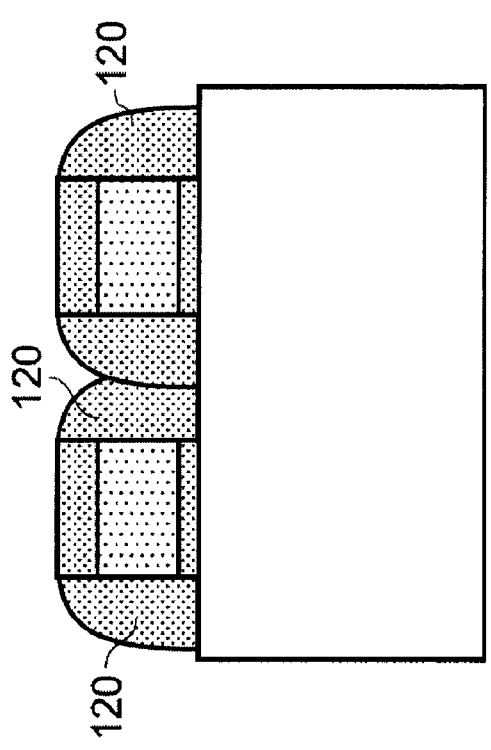

FIG. 6a shows the patterned gate structure for two adjacent devices each with gate dielectric 68, gate electrode 66 and hard mask 160 on substrate 60. FIG. 6b shows the structure after sidewall spacers 120 have been formed. FIG. 6c shows the structure after an isotropic etch has removed the outer sidewalls leaving residual centre sidewalls 121 between the closely spaced adjacent gate structures 66. These residual sidewalls 121 serve as an implant mask when a shallow n-type implant is carried out to form n+ source/drain regions 62, as shown in FIG. 6d. Other areas of the substrate 60 may be masked using a conventional photoresist pattern, but this need not be aligned critically to small gate features.

Figure 6G:
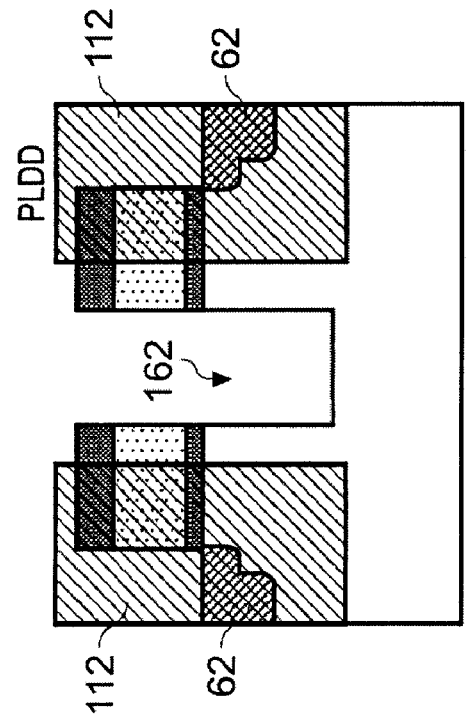
Figure 6E:
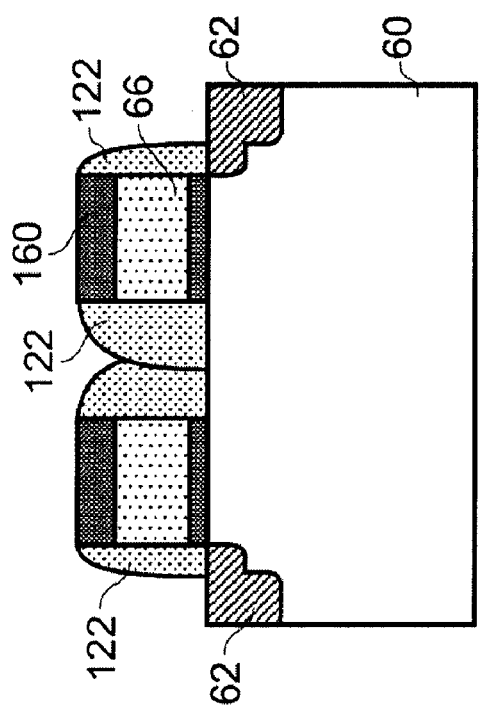
Figure 6H:
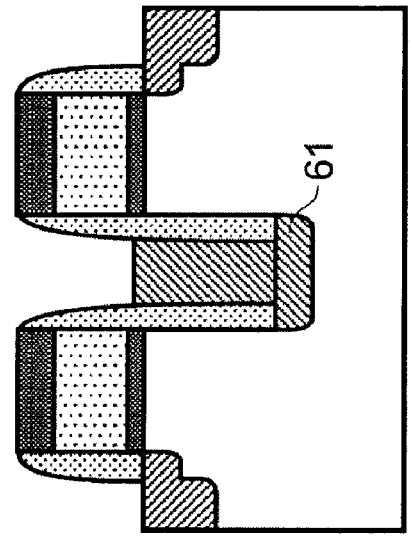
Figure 6F:
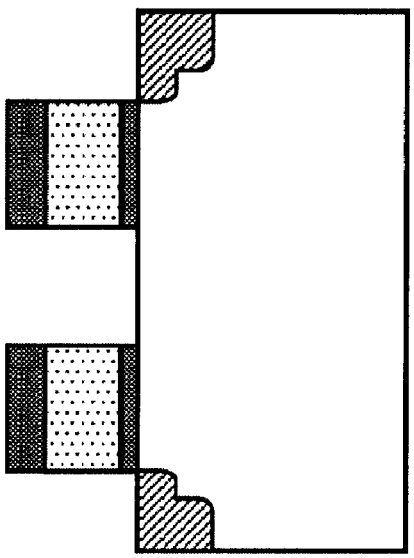

As shown in FIG. 6e, second spacers 122 are deposited on the gate sidewalls and also to top up the residual spacers 121. These spacers 122 serve as an implant mask when a deeper n-type implant is carried out to further form the n+ source/drain regions 62. Other areas of the substrate 60 may be masked using a conventional photoresist pattern, but this need not be aligned critically to small gate features. The spacers 122 are then removed as shown in FIG. 6f.

As shown in FIG. 6g, the n+ source/drain regions 62 are then masked using a photolithographic step with mask 112. In this stage, alignment to the small gate features is required. A trench or recess 162 is then etched, and into this recess is formed the source/drain region 61 using an implant and an epitaxial deposition process as described in connection with FIGS. 4b, 4c and 4e, to give the structure as shown in FIG. 6h.

FIGS. 7a to 7e depict a process in which the recess or trench for the p+ source/drain is formed before the gate structure.

Figure 7A:
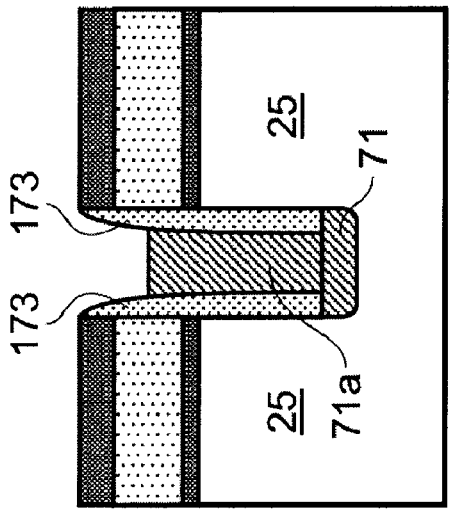
FIGS. 7a to 7e show a series of schematic cross-sectional views depicting an alternative process sequence for fabrication of a pair of devices each according to FIG. 2.
Figure 7B:
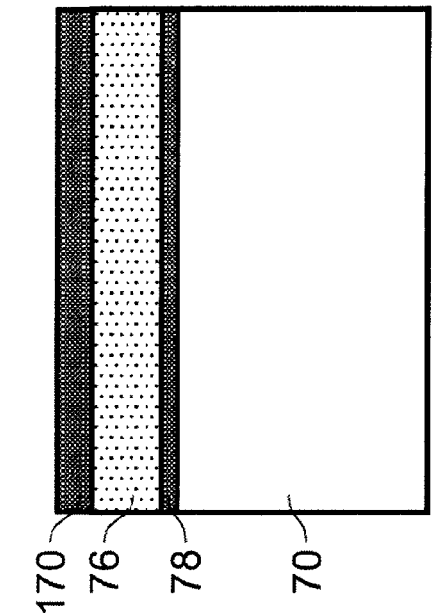
Figure 7C:
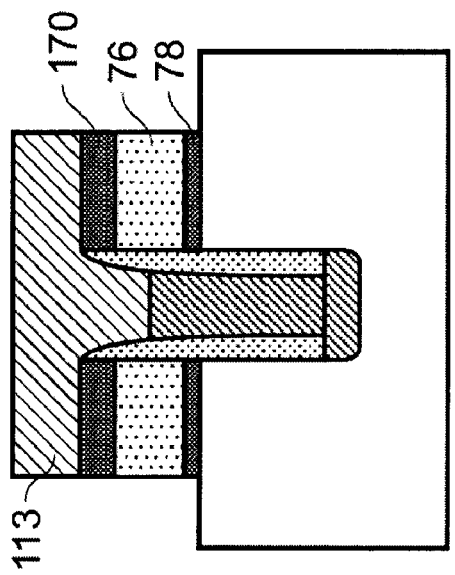

FIG. 7a shows the structure after growth of a gate dielectric 78 onto substrate 70, deposition of gate material 76 and deposition of hard mask material 170. As shown in FIG. 7b, a recess or trench 172 is then etched. As shown in FIG. 7c, a p+ implant is then performed into the bottom of the recess 172 to form p+ source/drain region 71. Sidewall spacers 173 are then formed on the sides of the recess covering what will become the intermediate portions 25 of the finished devices. An epitaxial deposition process is then used to form a further part 71a of the p+ source/drain region that is laterally separated from and electrically insulated from the intermediate portions 25 by the sidewall spacers.

Figure 7D:
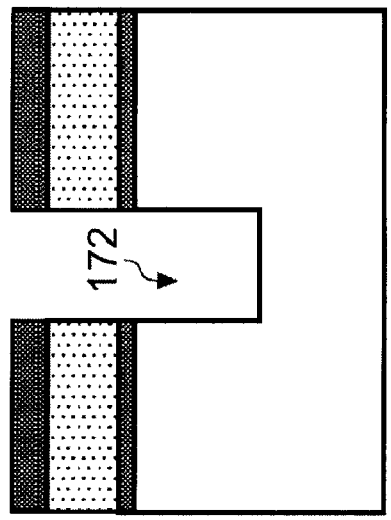
Figure 7E:
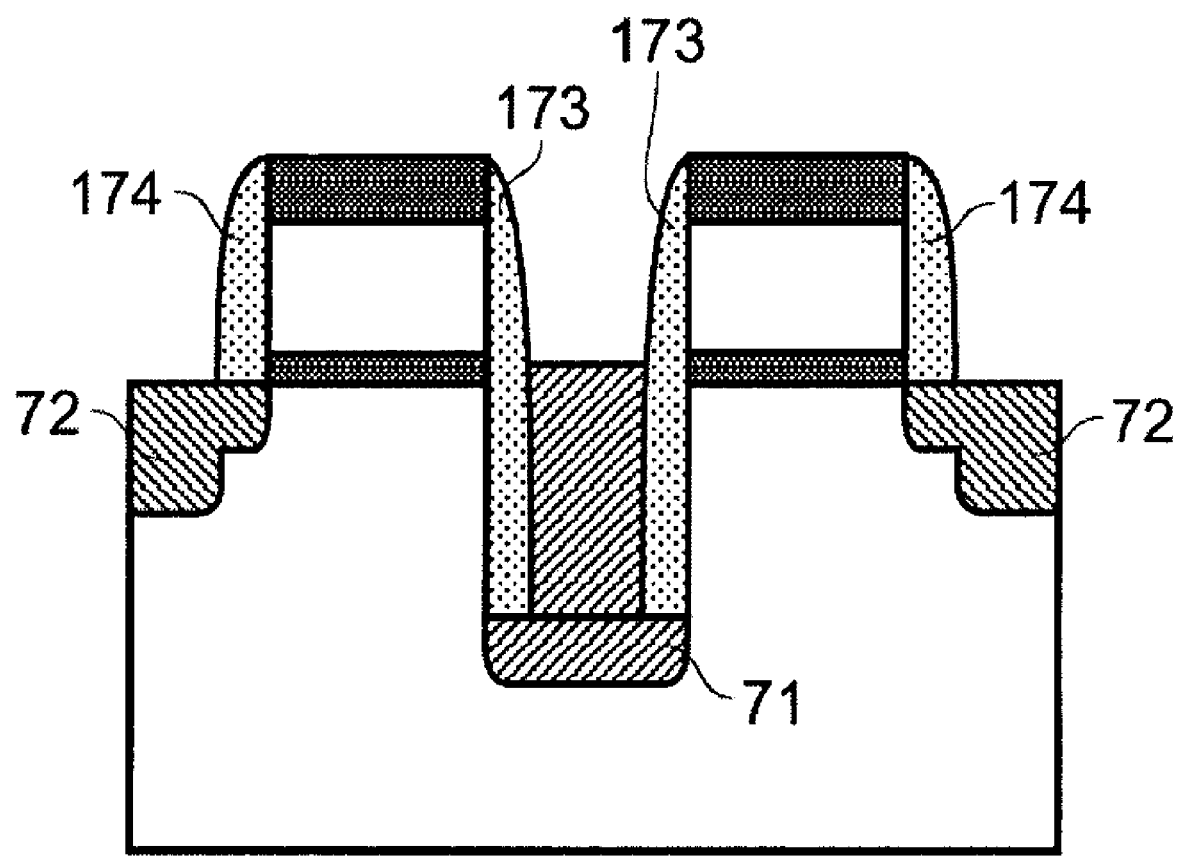

As shown in FIG. 7d, a mask 113 is then used to pattern the gate electrodes 76. As shown in FIG. 7e, a first, shallow n+ implant is then performed to form source/drain regions 72, sidewall spacers 174 are then deposited and a second, deeper n+ implant is performed to further form the source/drain regions 72. The mask 113 is then removed.

This process avoids critical alignment control to the gate structure, but alignment variability will affect the relative gate lengths of the left and right hand devices.

Although examples described above have referred to semiconductor devices formed on silicon substrates, it will be understood that the other semiconductor material systems can be used, for example germanium.

Figure 8:
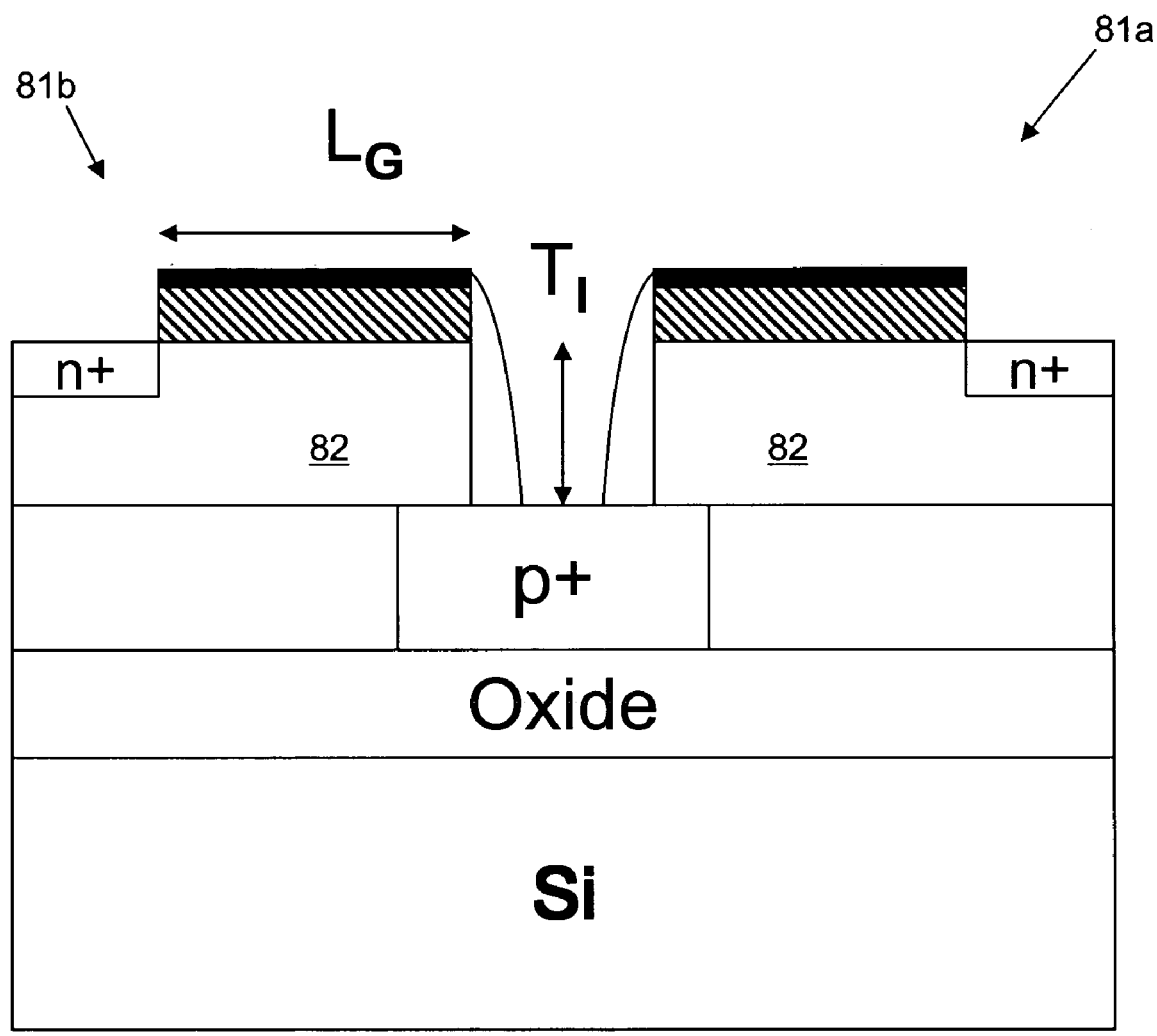
FIG. 8 shows a pair of devices each according to FIG. 2 and fabricated by a further alternative process sequence.

FIG. 8 illustrates in cross section an alternative version of a pair of devices 81a, 81b of the type described above, in which a trench of depth T, is used to produce the acceleration path for carriers in order to generate impact ionization collisions. Each device 81a, 81b may conveniently be termed a Trench Impact Ionization Transistor (TIIT, or TIIT MOSFET).

The devices 81 shown in FIG. 8 incorporate at least one silicon germanium (SiGe) layer 82 to reduce the voltage necessary to cause impact ionization collisions. The use of SiGe makes the device particularly well suited to sub-100 nm technology nodes, where the supply voltage is scaled down towards the sub-1V regime. Moreover, and different from conventional bulk devices, the TIIT allows for very fast switching times, because the device is not limited by conventional thermionic emission related issues. The TIIT device also exhibits a particularly high $I_{on}/I_{off}$ ratio. The large ratio between on and off drain current makes the TIIT particularly suitable for low-power applications.

Figure 9:
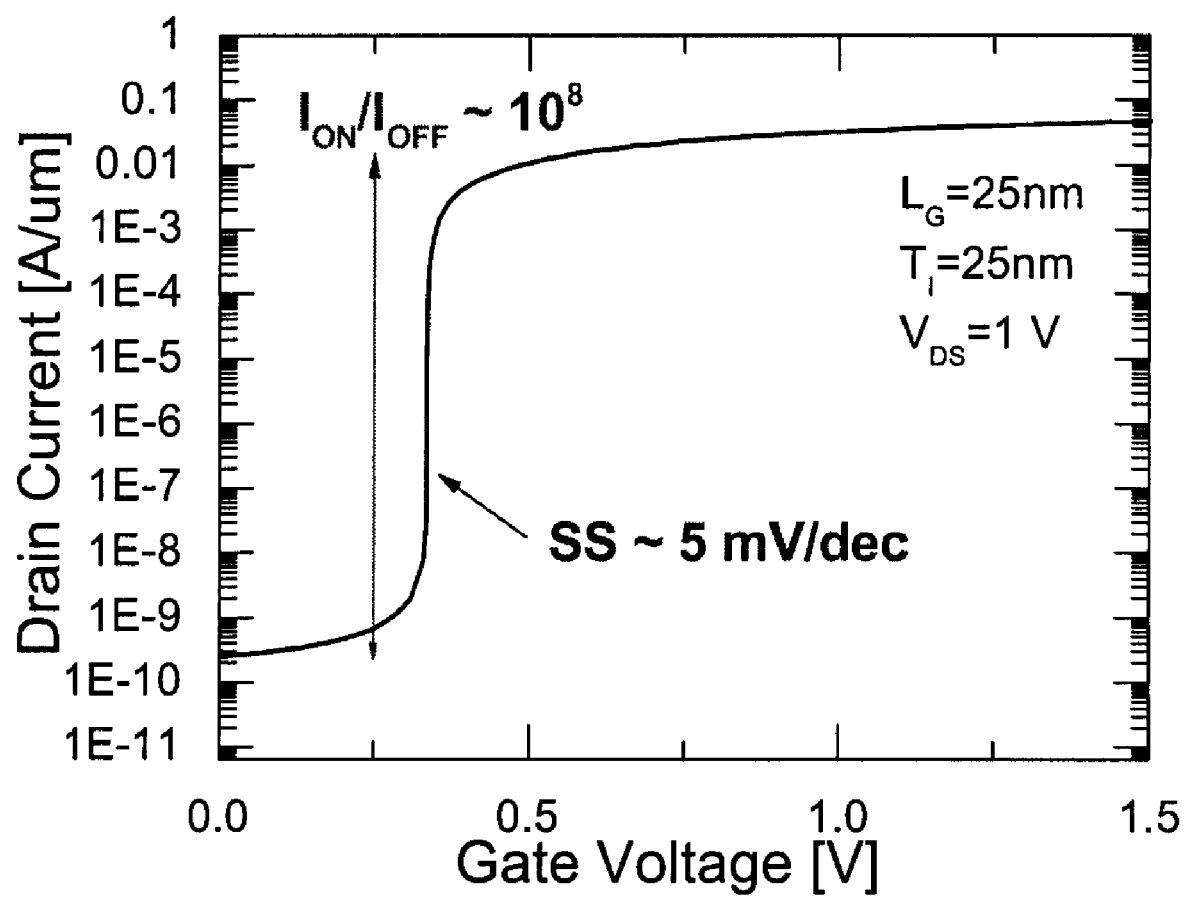
FIG. 9 shows simulation results of drain current as a function of gate voltage for a device according to FIG. 8.

FIG. 9 illustrates simulated $I_D$-$V_{GS}$ (drain current to gate-source voltage) characteristics for a TIIT MOSFET device, with a drain-source voltage $V_{DS}$ of 1 V. An exceptionally high $I_{ON}/I_{OFF}$ ratio of the order of 108 is demonstrated, with a subthreshold slope around 5 mV/decade.

Various advantages are offered by the alternative TIIT device of the form shown in FIG. 8, including one or more of the following:

i) The manufacturing process (described in further detail below) is fully CMOS compatible;

ii) each device can be well isolated, due to the substrate being of the form of a silicon-on-insulator (SOI) substrate; iii) a SiGe-based material being used for the intrinsic channel region allows a lowering of the electric field necessary to produce impact ionization events, making the device particularly compatible with the requirements of sub-100 nm technologies, demonstrated by simulating such devices operating at $V_{DD}$=1V;

iv) the use of a trench to form the intrinsic region 82 (FIG. 8) where carriers are accelerated allows for a high degree of control, for example through epitaxial growth processes;

v) the TIIT demonstrates suitability for extremely low power and high 5 frequency applications; and vi) an exceptional $I_{ON}/I_{OFF}$ ratio of ~$10^8$ and a subthreshold slope of ~5 mV/dec are demonstrated (via simulations).

It is understood that different embodiments disclosed herein offer different advantages, and that no particular advantage is necessarily required for all embodiments.

A possible fabrication scheme for the proposed device of FIG. 8 is illustrated in FIGS. 10a to 10h, as detailed below.

Figure 10A:
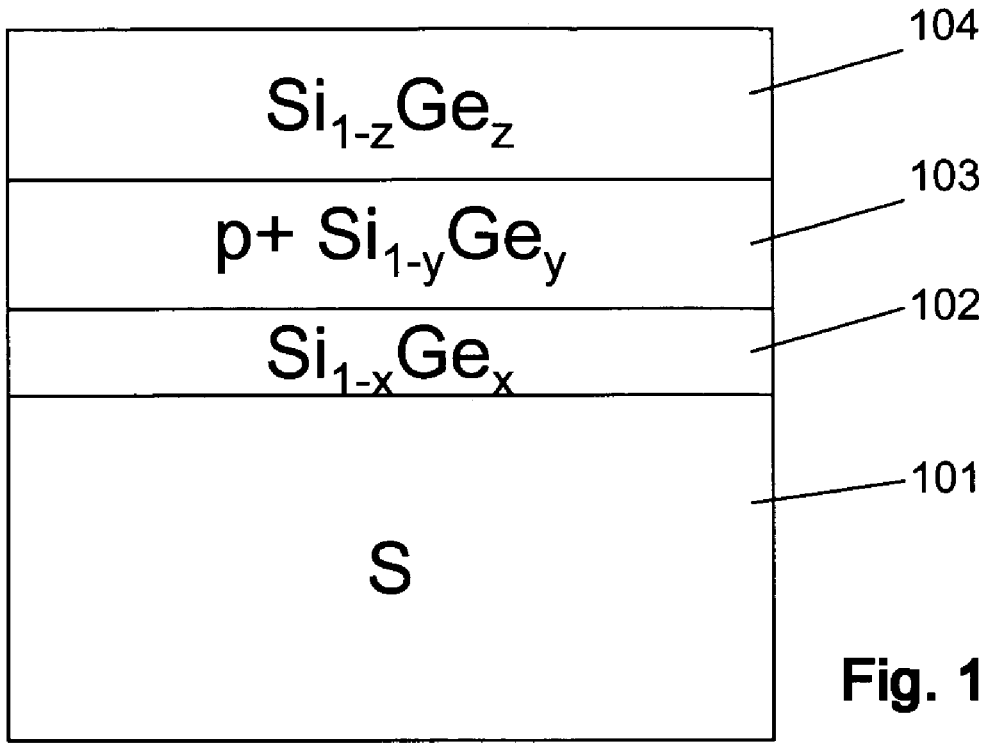
FIGS. 10a to 10h show a series of schematic cross-sectional views depicting a process sequence for fabrication of the pair of devices of FIG. 8.

Shown in FIG. 10a, the starting material is a conventional Si-substrate 101. Three different SiGe layers 102, 103, 104 having differing ratios of silicon to germanium are then formed on the substrate 101 by epitaxial growth. By using epitaxial growth, the $Si_{1-y}Ge_y$ layer 103, which eventually forms the source, can be grown as a p+ doped layer, thus removing the need for use of a subsequent doping process. Alternatively, the source may be formed during a later stage of the fabrication process, for example after the formation of the n+ drain regions.

Figure 10B:
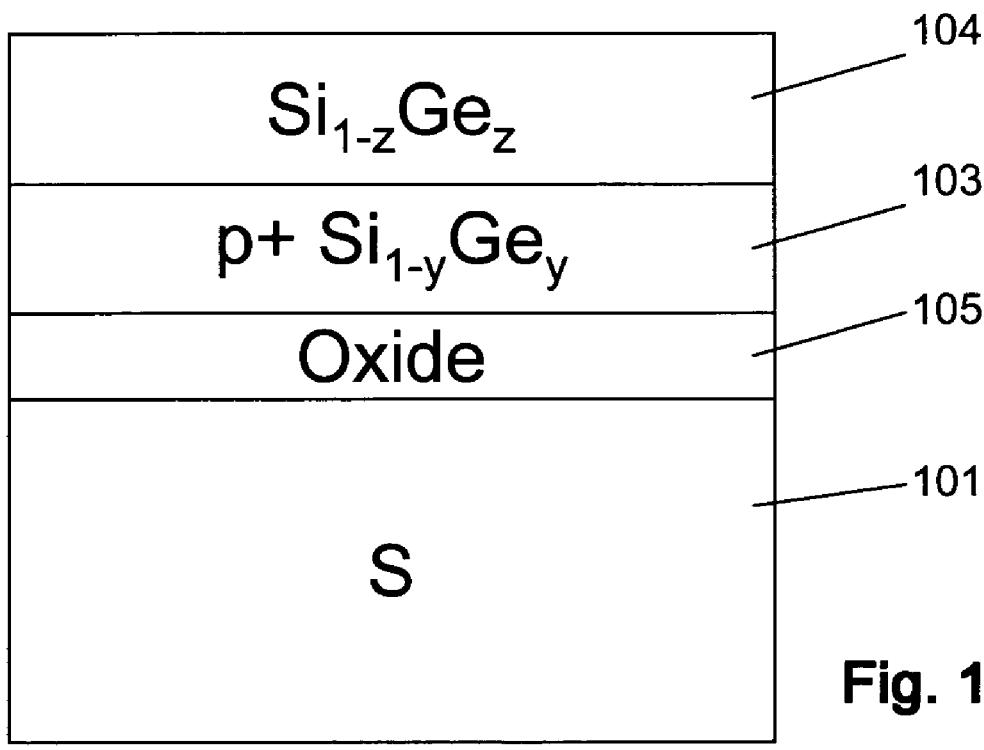

The $Si_{1-x}Ge_x$ layer 102 (where the ratio x is different to the ratio y for the second layer 103) is then selectively removed by a lateral etching process, and the gap left behind is filled with an oxide layer 105, resulting in the structure shown in FIG. 10b. The lateral etching process may involve a dry or wet etch. A wet etching process may, for example, involve an ammonia solution. This method of forming an SOI-type substrate allows the SiGe layers 103, 104 to be grown epitaxially relative to the underlying substrate 101, and then subsequently electrically isolated from the substrate by the oxide layer formed between the substrate and the SiGe layers 103, 104.

Figure 10C:
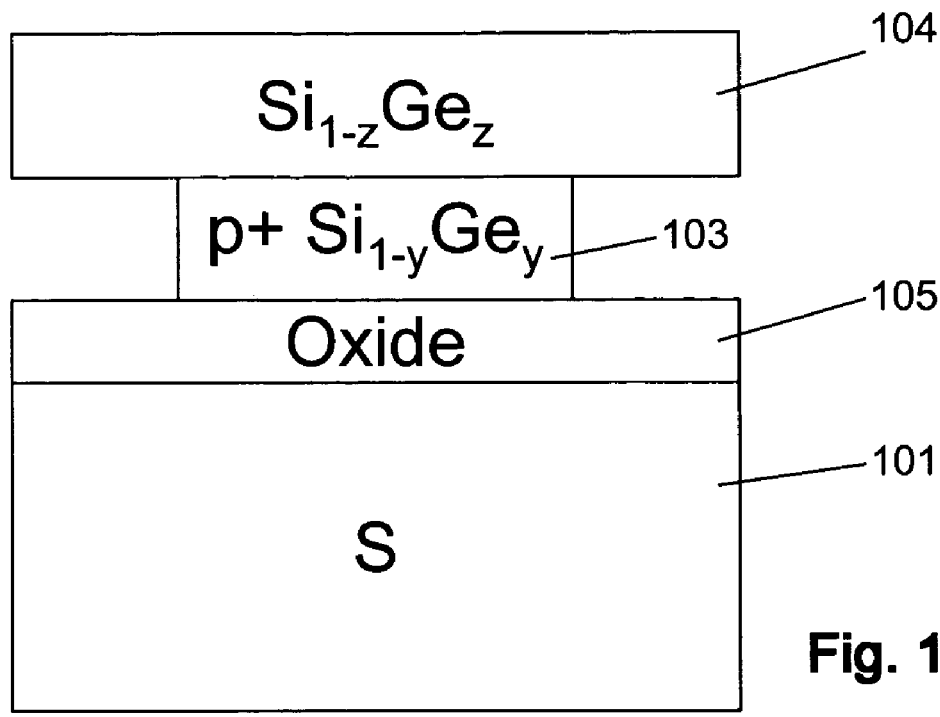
Figure 10D:
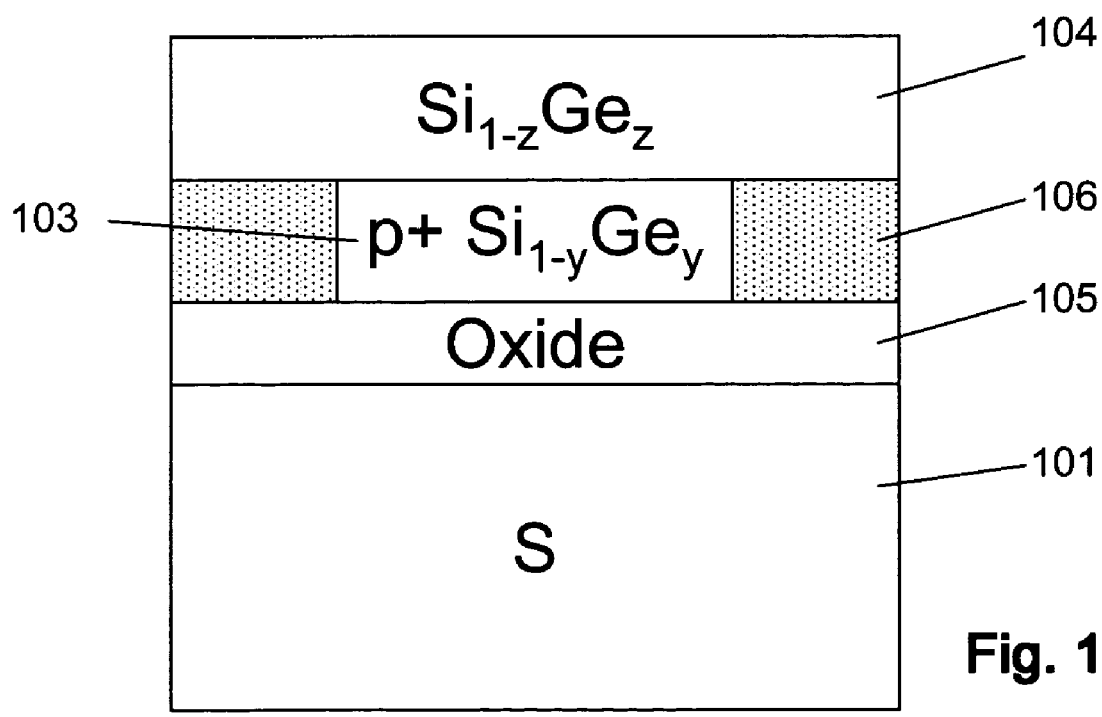

In a further optional series of fabrication steps, shown in FIGS. 10c and 10d, portions of the $Si_{1-y}Ge_y$ layer 103 may be selectively laterally etched (FIG. 10c) relative to the further layer 104, and back-filled with a further oxide layer 106, which serves to electrically isolate the $Si_{1-y}Ge_y$ layer 103 in adjacent devices.

Figure 10E:
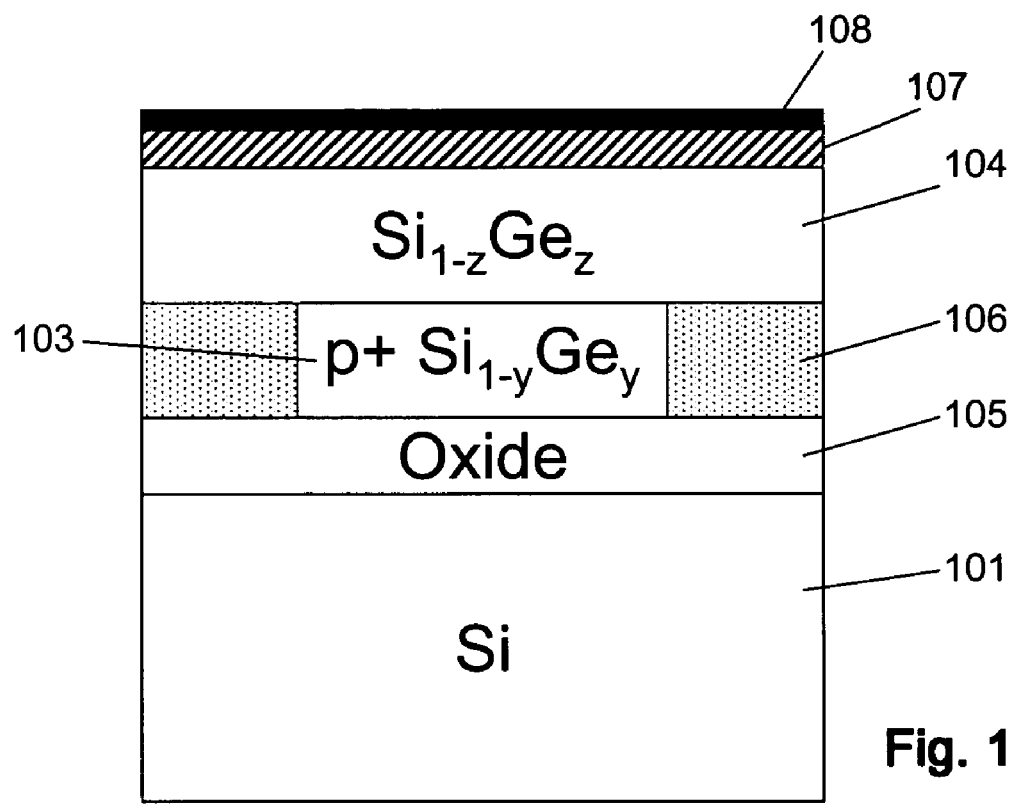
Figure 10F:
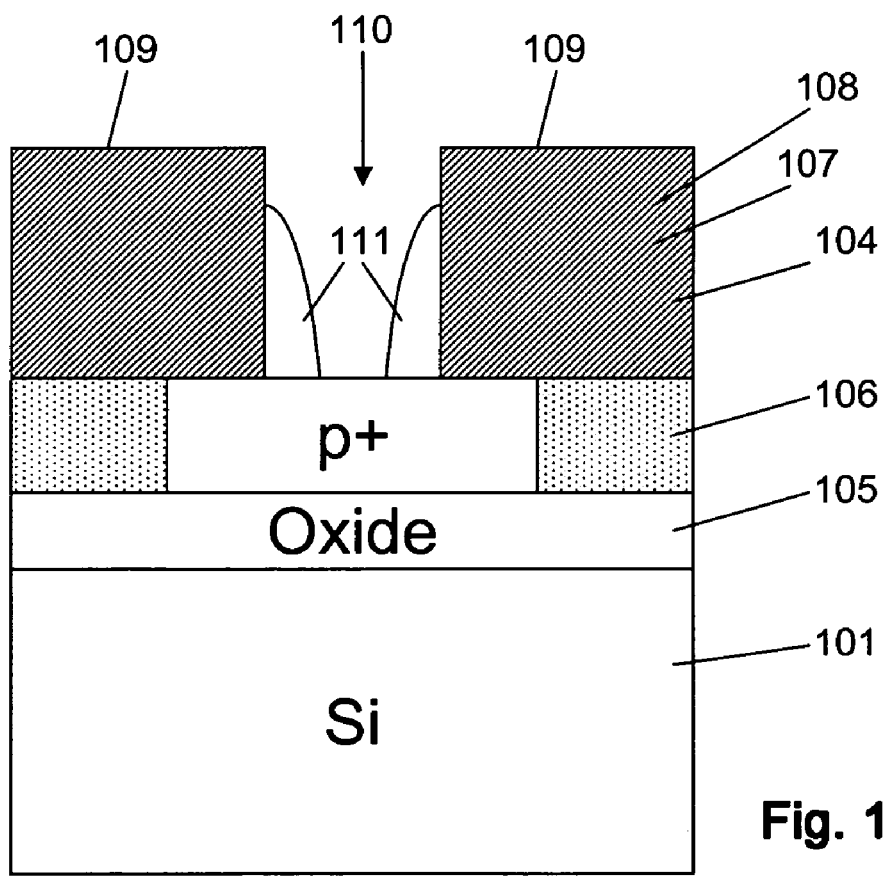

As shown in FIG. 10e, a gate structure comprising a dielectric layer 107 (being either a conventional oxide layer or a high-k metal oxide layer) and a gate electrode layer 108 is then formed over the $Si_{1-z}Ge_z$ layer 104.

A mask 109 (FIG. 10f) is applied over the gate electrode 108, the mask 109 defining a gap in which a trench 110 is then etched through the gate electrode, gate oxide layer 107 and $Si_{1-x}Ge_z$ layer 104. Sidewall spacers 111 are deposited on the walls of the trench 110. The mask 109 is then removed.

Figure 10G:
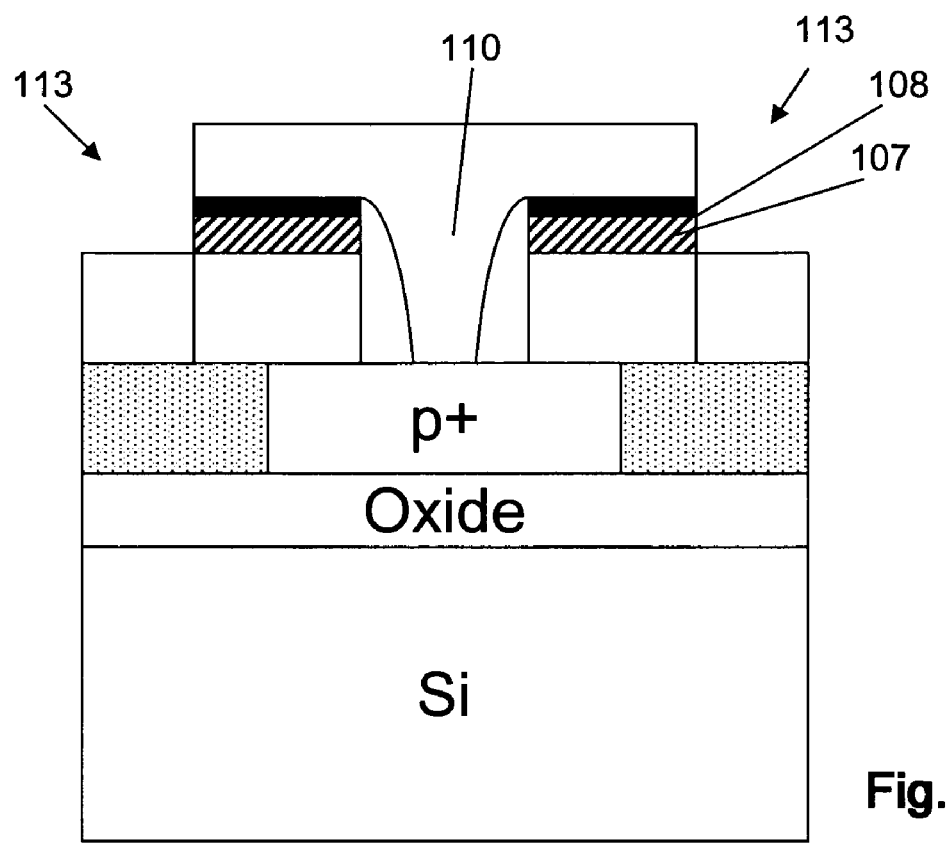
Figure 10H:
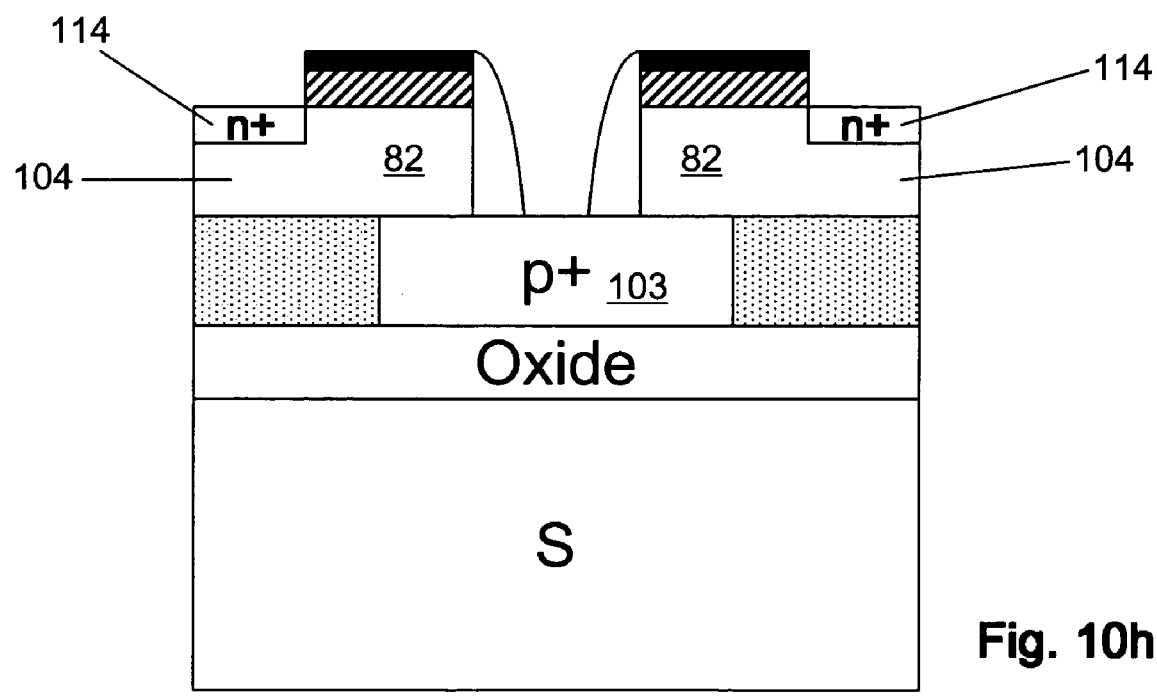

As shown in FIG. 10g, a further mask 112 is then applied over the trench 110 to define the drain regions 113 of the devices, the gate electrode 108 and oxide layer 107 being etched away either side of the mask 112. The drain regions 103 are then defined by n+ doping either side of the mask 112. After the mask 112 is removed, the final structure as shown in FIG. 10h is revealed, with a common p+ source region defined by the Si1-yGey layer 103 and n+ drain regions 114 defined in the $Si_{1-z}Ge_z$ layer 104.

Other embodiments are intentionally within the scope of the accompanying claims.

The invention claimed is:

1. A semiconductor device comprising:
a first source/drain region having a first doping level;
a second source/drain region having a second doping level and of opposite dopant type to the first source/drain region;
the first and second source/drain regions being laterally separated by an intermediate region having a doping level less than either of the first and second doping levels;
a gate electrode electrically insulated from, and disposed over, the intermediate region, the first and second source/drain regions being laterally aligned with the gate electrode;
the entire portion of the first source/drain region that forms a boundary with the intermediate region being separated vertically from the top of the intermediate region,
wherein the portion of the first source/drain region that forms a boundary with the intermediate region is separated vertically from the lowest part of the second source/drain region, and
wherein the first source/drain region is disposed within a trench etched into a substrate of the device, and further comprising a corresponding device formed on the substrate immediately adjacent to said device, the first source/drain region of each device sharing the trench.

2. The device of claim 1 wherein the first and second source/drain regions and the intermediate region are defined within a semiconductor layer, the first source/drain region having a first portion disposed at the bottom of a trench etched into the semiconductor layer and a second portion within the trench separated from a sidewall of the trench laterally adjacent to the intermediate region by way of an insulating spacer structure.

3. The device of claim 2 in which wherein the second portion of the first source/drain region is a deposited semiconductor layer.

4. The device of claim 3 in which wherein the second portion of the first source/drain region is an epitaxially deposited semiconductor layer.

5. The device of claim 2 wherein the second portion of the first source/drain region extends upwards at least as far as the top surface of the intermediate region.

6. The device of claim 2 in which wherein the first portion of the first source/drain region is an implanted dopant region of the semiconductor layer.

7. The device of claim 1 wherein the device is operable as an impact ionization MOSFET.

8. The device of claim 1 in which wherein the first source/drain region has a p-type dopant and the second source/drain region has an n-type dopant.

9. The device of claim 1 in which wherein the first source/drain region is separated from an underlying portion of the substrate by an oxide layer.

10. The device of claim 1 wherein the first source/drain region is formed from a silicon-germanium layer.

11. The device of claim 1 wherein the intermediate region is formed of silicon germanium.

12. A method for fabricating a semiconductor device on a substrate comprising the steps of:
forming a first source/drain region having a first doping level;
forming a second source/drain region having a second doping level and of opposite dopant type to the first source/drain region, the first and second source/drain regions being laterally separated by an intermediate region having a doping level less than either of the first and second doping levels, wherein the entire portion of the first source/drain region that forms a boundary with the intermediate region is separated vertically from the top of the intermediate region;
forming a gate electrode electrically insulated from, and disposed over, the intermediate region such that the intermediate region is completely underlying a bottom surface of the gate electrode, the first and second source/drain regions being laterally aligned with the gate electrode; and
forming a spacer of dielectric material along a sidewall of a recess in the substrate, wherein the sidewall is laterally adjacent to the intermediate region and the spacer is disposed between a portion of the first source/drain region and the intermediate region.

13. The method of claim 12 wherein the forming the first source/drain region comprises etching the recess into the substrate in which the first source/drain region can be formed.

14. The method of claim 13 wherein the forming the first source/drain region further includes introducing dopant into the bottom of the recess.

15. The method of claim 14 wherein the introducing dopant into the bottom of the recess includes implanting dopant into the substrate at the bottom of the recess.

16. The method of claim 14 wherein the introducing dopant into the bottom of the recess includes depositing doped material into the recess.

17. The method of claim 14 further including, after the introducing dopant into the bottom of the recess, at least partially filling the recess with doped material to form a further part of the first source/drain region, the further part of the first source/drain region being separated from the intermediate region by the spacer.

18. The method of claim 13 further including aligning the recess etched relative to an edge of the gate electrode such that an edge of the recess etched is vertically aligned and substantially coplanar with the edge of the gate electrode.

19. The method of claim 12 wherein the first source/drain region is separated from an underlying portion of the substrate by an oxide layer.

20. The method of claim 19 wherein the oxide layer is formed within a gap between the first source/drain region and the underlying portion of the substrate, and
wherein the gap is formed by selective lateral etching of a silicon germanium layer positioned between the first source/drain region and the underlying portion of the substrate.

21. The method of claim 12 wherein the first source/drain region and the intermediate region are formed over the substrate by epitaxial growth.

* * * * *

Disclaimer

8,227,841 B2 — Gilberto Curatola, Korbek-Lo, Belgium, SELF-ALIGNED IMPACT-IONIZATION FIELD EFFECT TRANSISTOR. Patent dated July 24, 2012. Disclaimer filed January 29, 2013, by the assignee, Taiwan Semiconductor Manufacturing, Ltd.

Hereby enters this disclaimer to claims 1-8 and 10-18 of said patent.

*(Official Gazette, April 16, 2013)*